(12) United States Patent
Shim et al.

(10) Patent No.: US 11,974,397 B2
(45) Date of Patent: Apr. 30, 2024

(54) CIRCUIT BOARD MODULE AND ELECTRONIC DEVICE INCLUDING THE SAME

(71) Applicant: SAMSUNG ELECTRONICS CO., LTD., Suwon-si (KR)

(72) Inventors: Seungbo Shim, Suwon-si (KR); Junghoon Park, Suwon-si (KR); Dongil Son, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 199 days.

(21) Appl. No.: 17/431,917

(22) PCT Filed: Aug. 13, 2021

(86) PCT No.: PCT/KR2021/010808
§ 371 (c)(1),
(2) Date: Aug. 18, 2021

(87) PCT Pub. No.: WO2022/039454
PCT Pub. Date: Feb. 24, 2022

(65) Prior Publication Data
US 2022/0361335 A1 Nov. 10, 2022

(30) Foreign Application Priority Data
Aug. 18, 2020 (KR) .................. 10-2020-0103172

(51) Int. Cl.
*H05K 1/14* (2006.01)
*H04M 1/02* (2006.01)
(Continued)

(52) U.S. Cl.
CPC ............ *H05K 1/14* (2013.01); *H04M 1/0249* (2013.01); *H05K 1/0216* (2013.01); *H05K 1/181* (2013.01);
(Continued)

(58) Field of Classification Search
CPC .................. H05K 1/14; H05K 2201/10378
(Continued)

(56) References Cited

U.S. PATENT DOCUMENTS

2005/0168961 A1* 8/2005 Ono .................. H01L 25/0652
257/E25.011
2008/0067659 A1 3/2008 Kim et al.
(Continued)

FOREIGN PATENT DOCUMENTS

JP  06-132688  5/1994
JP  06-260226  9/1994
(Continued)

OTHER PUBLICATIONS

Search Report and Written Opinion dated Nov. 30, 2021 in counterpart International Patent Application No. PCT/KR2021/010808.
(Continued)

*Primary Examiner* — Binh B Tran
(74) *Attorney, Agent, or Firm* — NIXON & VANDERHYE P.C.

(57) ABSTRACT

According to various embodiments of the disclosure, an electronic device may comprise: a display, a first circuit board disposed under the display, at least one component disposed on one surface of the first circuit board, an interposer surrounding at least two sides of the at least one component and disposed on the first circuit board, and a second circuit board spaced apart from the first circuit board and including an area joined with the interposer. The interposer may include: a first interposer portion disposed along a first area of the first circuit board, a first end of the first interposer having at least a portion including a non-shielding area, and a second interposer portion disposed along a second area, adjacent to the first area, of the first circuit board, a second end of the second interposer facing the first
(Continued)

end and having at least a portion including a non-shielding area.

14 Claims, 13 Drawing Sheets

(51) Int. Cl.
*H05K 1/02* (2006.01)
*H05K 1/18* (2006.01)
*H05K 7/14* (2006.01)

(52) U.S. Cl.
CPC . *H05K 7/1427* (2013.01); *H05K 2201/10378* (2013.01)

(58) Field of Classification Search
USPC .......................................... 361/748

See application file for complete search history.

(56) References Cited

U.S. PATENT DOCUMENTS

| 2018/0081481 | A1  | 3/2018  | Fournier et al. |
| 2018/0084636 | A1* | 3/2018  | Pakula ................ H01M 50/247 |
| 2019/0082536 | A1  | 3/2019  | Park et al. |
| 2019/0306979 | A1  | 10/2019 | Chen et al. |
| 2020/0093040 | A1  | 3/2020  | Yun et al. |
| 2020/0205289 | A1* | 6/2020  | Iida ........................ H05K 1/028 |

FOREIGN PATENT DOCUMENTS

| JP | 2010-219180    | 9/2010  |
| JP | 2015-122397    | 7/2015  |
| KR | 10-0761860     | 9/2007  |
| KR | 10-2019-0029215 | 3/2019  |
| KR | 10-2020-0116414 | 10/2020 |

OTHER PUBLICATIONS

Extended European Search Report for EP Application No. 21858541.2 dated Nov. 8, 2023, 8 pages.

* cited by examiner

CIRCUIT BOARD MODULE AND ELECTRONIC DEVICE INCLUDING THE SAME

CROSS-REFERENCE TO RELATED APPLICATIONS

This application is a national stage of International Application No. PCT/KR2021/010808 designating the United States, filed on Aug. 13, 2021, in the Korean Intellectual Property Receiving Office and claiming priority to Korean Patent Application No. 10-2020-0103172, filed on Aug. 18, 2020, in the Korean Intellectual Property Office, the disclosures of which are incorporated by reference herein in their entireties.

BACKGROUND

Field

The disclosure relates to a circuit board module including a plurality of interposers, and an electronic device including the circuit board module.

Description of Related Art

Advancing information communication and semiconductor technologies accelerate the spread and use of various electronic devices. In particular, recent electronic devices are being developed to carry out communication while carried on.

The term "electronic device" may refer to a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

The printed circuit board disposed in the electronic device may be manufactured as a stacked printed circuit board (e.g., a circuit board module) for mounting efficiency. The interposer disposed in the multilayer printed circuit board may be designed in a closed loop shape according to the shape of the electronic device/printed circuit board. Such an interposer is not standardized in shape, is large, and has many inflection points, and may thus be vulnerable to bending (e.g., warpage, ball open) and cracks. Further, as the interposer is manufactured as a closed loop having one large size, the number of interposers produced from a raw material of printed circuit board is reduced, and material costs may be increased.

In general, in a process, dummy-shaped (e.g., bridge) handles protruding from the interposer are formed to transport or plate the interposer. A closed loop-shaped interposer has no choice but to have protruding dummies only on the inner side and/or the outer side, and the protruding dummies may be excluded from plating. Accordingly, side plating of the interposer, which is necessary for shielding with the outside, may be partially cut off.

SUMMARY

Embodiments of the disclosure provide an interposer structure wherein it is possible to reduce bending (e.g., warpage, ball open) and cracks of the circuit board module, which may be caused in one closed loop shape, and enhance electrical connection between stacked printed circuit boards by implementing a plurality of discontinuous and separated interposers.

Embodiments of the disclosure provide a plurality of separated interposers which, as manufactured, the raw material of printed circuit board may be more usable. Thus, it is possible to save manufacturing costs due to an increase in the number of interposers manufactured.

Embodiments of the disclosure provide an interposer structure wherein it is possible to prevent and/or reduce partial disconnection of side plating of the interposer by manufacturing a plurality of separated interposers and providing protruding dummies on two opposite ends thereof.

According to various example embodiments, an electronic device may comprise: a display, a first circuit board disposed under the display, at least one component disposed on one surface of the first circuit board, an interposer surrounding at least two sides of the at least one component and disposed on the first circuit board, and a second circuit board at least partially spaced apart from the first circuit board and including an area joined with the interposer. The interposer may include: a first interposer portion disposed along a first area of the first circuit board, a first end of the first interposer portion having at least a portion including a non-shielding area, and a second interposer portion disposed along a second area, adjacent to the first area, of the first circuit board, a second end of the second interposer portion facing the first end of the first interposer portion and having at least a portion including a non-shielding area.

According to various example embodiments, an electronic device may comprise: a display, a first circuit board disposed under the display, at least one component disposed on one surface of the first circuit board, a second circuit board disposed on the first circuit board spaced apart from the first circuit board, and an interposer disposed between the first circuit board and the second circuit board and disposed on the first circuit board surrounding at least two sides of the at least one component. The interposer may include a first interposer portion disposed along a first area of the first circuit board and including a first dummy protruding from an area of a first end in a first direction and a second interposer portion disposed along a second area, adjacent to the first area, of the first circuit board, and including a second dummy protruding from an area of a second end, facing the first end, in a second direction opposite to the first direction.

According to various example embodiments, an electronic device may comprise: a display, a first circuit board disposed under the display, at least one component disposed on one surface of the first circuit board, an interposer surrounding at least two sides of the at least one component and disposed on the first circuit board, and a second circuit board at least partially spaced apart from the first circuit board and including an area joined with the interposer. The interposer may include: a first interposer portion disposed along a first area of the first circuit board and including a first end and a second interposer portion disposed along a second area, adjacent to the first area, of the first circuit board and including a second end at least partially facing the first end. When viewed from a side of the interposer, the first end of the first interposer portion may at least partially overlap the second end of the second interposerportion.

According to various example embodiments of the disclosure, there may be provided a circuit board module including an interposer split into a plurality of interposer portions.

According to various example embodiments of the disclosure, as a plurality of discontinuous, separated interposers are implemented, it is possible to reduce bending (e.g., warpage or ball open) of the circuit board module and to save material costs by increasing utilization of the printed circuit board raw plate material and hence increasing the number of interposers manufactured.

According to various example embodiments of the disclosure, as a plurality of discontinuous, separated interposers are implemented, dummies which are conventionally positioned inside or outside are positioned on two opposite ends. Thus, it is possible to prevent and/or reduce side plating of the interposer from being partially broken. It is therefore possible to enhance EMI/EMC performance.

Effects of the disclosure are not limited to the foregoing, and other unmentioned effects would be apparent to one of ordinary skill in the art from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
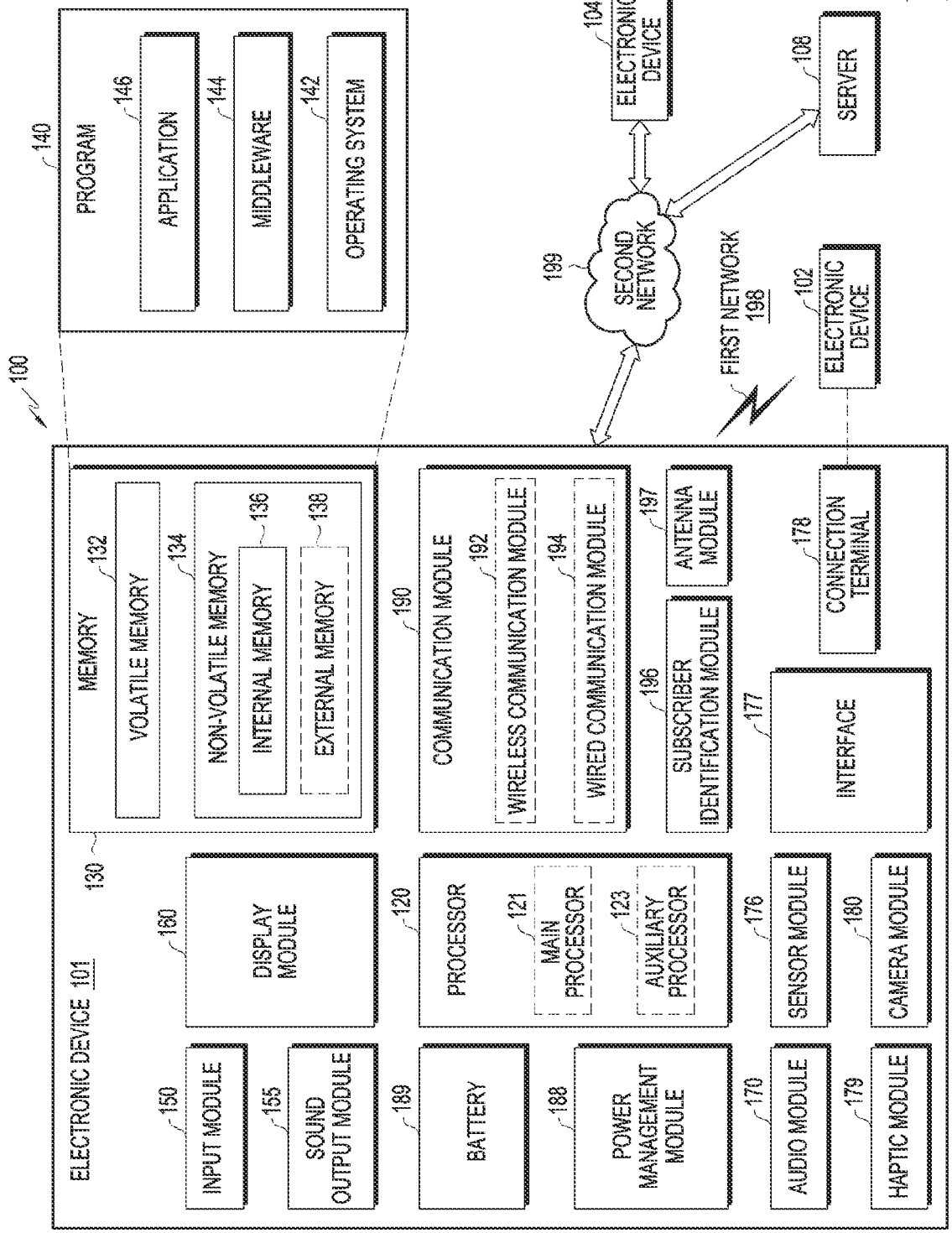
FIG. 1 is a diagram illustrating an example electronic device in a network environment according to various embodiments.

FIG. 1 is a block diagram illustrating an example electronic device in a network environment according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120 and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150 or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments may be one of various types of electronic devices. The electronic devices may include, for example, a portable communication device (e.g., a smart phone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
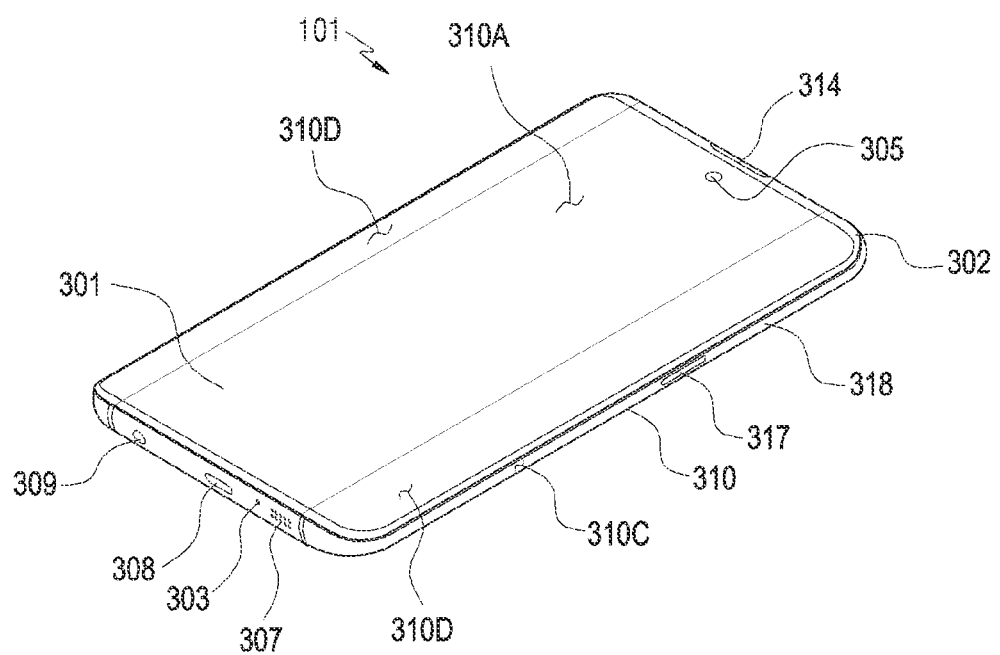
FIG. 2 is a front perspective view illustrating an electronic device according to various embodiments.
Figure 3:
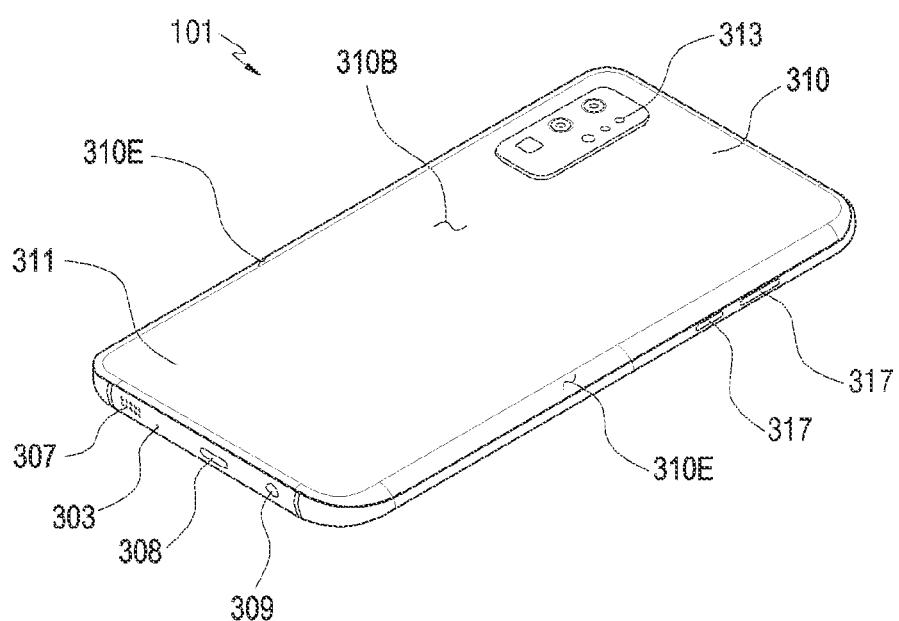
FIG. 3 is a rear perspective view illustrating an electronic device according to various embodiments.

FIG. 2 is a front perspective view illustrating an electronic device according to various embodiments; FIG. 3 is a rear perspective view illustrating an electronic device according to various embodiments.

Referring to FIGS. 2 and 3, according to an embodiment, an electronic device 101 may include a housing 310 with a front surface 310A, a rear surface 310B, and a side surface 310C surrounding a space between the front surface 310A and the rear surface 310B. According to an embodiment (not shown), the housing 310 may denote a structure forming part of the front surface 310A, the rear surface 310B, and the side surface 310C of FIG. 2. According to an embodiment, at least part of the front surface 310A may have a substantially transparent front plate 302 (e.g., a glass plate or polymer plate including various coat layers). The rear surface 310B may be formed by a rear plate 311. The rear plate 311 may be formed of, e.g., glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. According to an embodiment, the rear plate 311 and the side bezel plate 318 may be integrally formed together and include the same material (e.g., glass, metal, such as aluminum, or ceramic).

In the embodiment illustrated, the front plate 302 may include two first edge areas 310D, which seamlessly and bendingly extend from the first surface 310A to the rear plate 311, on both the long edges of the front plate 302. In the embodiment (refer to FIG. 3) illustrated, the rear plate 311 may include two second edge areas 310E, which seamlessly and bendingly extend from the rear surface 310B to the front plate, on both the long edges. According to an embodiment, the front plate 302 (or the rear plate 311) may include only one of the first edge areas 310 (or the second edge areas 310E). Alternatively, the first edge areas 310D or the second edge areas 301E may partially be excluded. According to an embodiment, at side view of the electronic device 101, the side bezel structure 318 may have a first thickness (or width) for sides that do not have the first edge areas 310D or the second edge areas 310E and a second thickness, which is smaller than the first thickness, for sides that have the first edge areas 310D or the second edge areas 310E.

According to an embodiment, the electronic device 101 may include at least one of a display 301, audio modules 303, 307, and 314 (e.g., the audio module 170 of FIG. 1), a sensor module (e.g., the sensor module of FIG. 1). 176), camera modules 305, 312, and 313 (e.g., the camera module 180 of FIG. 1), a key input device 317 (e.g., the input module 150 of FIG. 1), and connector holes 308 and 309 (e.g., the connection terminal 178 of FIG. 1). According to an embodiment, the electronic device 101 may exclude at least one (e.g., the connector hole 309) of the components or may add other components.

According to an embodiment, the display 301 may be visible through, e.g., a majority portion of the front plate 302. According to an embodiment, at least a portion of the display 301 may be visible through the front plate 302 forming the front surface 310A and the first edge areas 310D. According to an embodiment, the edge of the display 301 may be formed to be substantially the same in shape as an adjacent outer edge of the front plate 302. According to an embodiment (not shown), the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the front surface 310A and first edge areas 310D.

According to an embodiment, a recess or opening may be formed in a portion of the screen display area (e.g., the front surface 310A or the first edge area 310D) of the display 301, and at least one or more of the audio module 314, sensor module (not shown), light emitting device (not shown), and camera module 305 may be aligned with the recess or opening. According to an embodiment (not shown), at least one or more of the audio module 314, sensor module (not shown), camera module 305, fingerprint sensor (not shown), and light emitting device (not shown) may be included on the rear surface of the screen display area of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the key input device 317 may be disposed in the first edge areas 310D and/or the second edge areas 310E.

According to an embodiment, the audio modules 303, 307, and 314 may include, e.g., a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. According to an embodiment, the speaker holes 307 and 314 and the microphone hole 303 may be implemented as a single hole, or speakers may be rested without the speaker holes 307 and 314 (e.g., piezo speakers). The audio modules 303, 307, and 314 are not limited to the above-described structure. Depending on the structure of the electronic device 101, various design changes may be made—e.g., only some of the audio modules may be mounted, or a new audio module may be added.

According to an embodiment, the sensor modules (not shown) may generate an electrical signal or data value corresponding to an internal operating state or external environmental state of the electronic device 101. The sensor modules (not shown) may include a first sensor module (e.g., a proximity sensor) and/or a second sensor module (e.g., a fingerprint sensor) disposed on the front surface 310A of the housing 310 and/or a third sensor module (e.g., an HRM sensor) and/or a fourth sensor module (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure. Depending on the structure of the electronic device 101, various design changes may be made—e.g., only some of the sensor modules may be mounted, or a new sensor module may be added.

According to an embodiment, the camera modules 305, 312, and 313 may include a first camera module 305 disposed on the first surface 310A of the electronic device 101, and a rear camera device 312 and/or a flash 313 disposed on the rear surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101. The camera modules 305, 312, and 313 are not limited to the above-described structure. Depending on the structure of the electronic device 101, various design changes may be made—e.g., only some of the camera modules may be mounted, or a new camera module may be added.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the plurality of camera modules 305 and 312 may form, for example, a wide-angle camera and at least another of the plurality of camera modules may form a telephoto camera. Similarly, at least one of the plurality of camera modules 305 and 312 may form, for example, a front camera and at least another of the plurality of camera modules may form a rear camera. Further, the plurality of camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module 316 disposed on the second surface 310B of the housing 310.

According to an embodiment, the light emitting device (not shown) may be disposed on, e.g., the front surface 310A of the housing 310. The light emitting device (not shown) may provide, e.g., information about the state of the electronic device 101 in the form of light. According to an embodiment, the light emitting device (not shown) may provide a light source that interacts with, e.g., the front camera module 305. The light emitting device (not shown) may include, e.g., a light emitting device (LED), an infrared (IR) LED, and/or a xenon lamp.

According to an embodiment, the connector holes 308 and 309 may include, e.g., a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device.

According to an embodiment, some 305 of the camera modules 305 and 312 and/or some of the sensor modules (not shown) may be disposed to be exposed to the outside through at least a portion of the display 301. For example, the camera module 305 may include a punch hole camera disposed inside a hole or recess formed in the rear surface of the display 301. According to an embodiment, the camera module 312 may be disposed inside the housing 310 so that the lens is exposed to the second surface 310B of the electronic device 101. For example, the camera module 312 may be disposed on a printed circuit board (e.g., the printed circuit board 340 of FIG. 4).

According to an embodiment, the camera module 305 and/or the sensor module may be disposed to contact the external environment through a transparent area from the internal space of the electronic device 101 to the front plate 302 of the display 301. Further, some sensor module 304 may be disposed to perform its functions without being visually exposed through the front plate 302 in the internal space of the electronic device.

Figure 4:
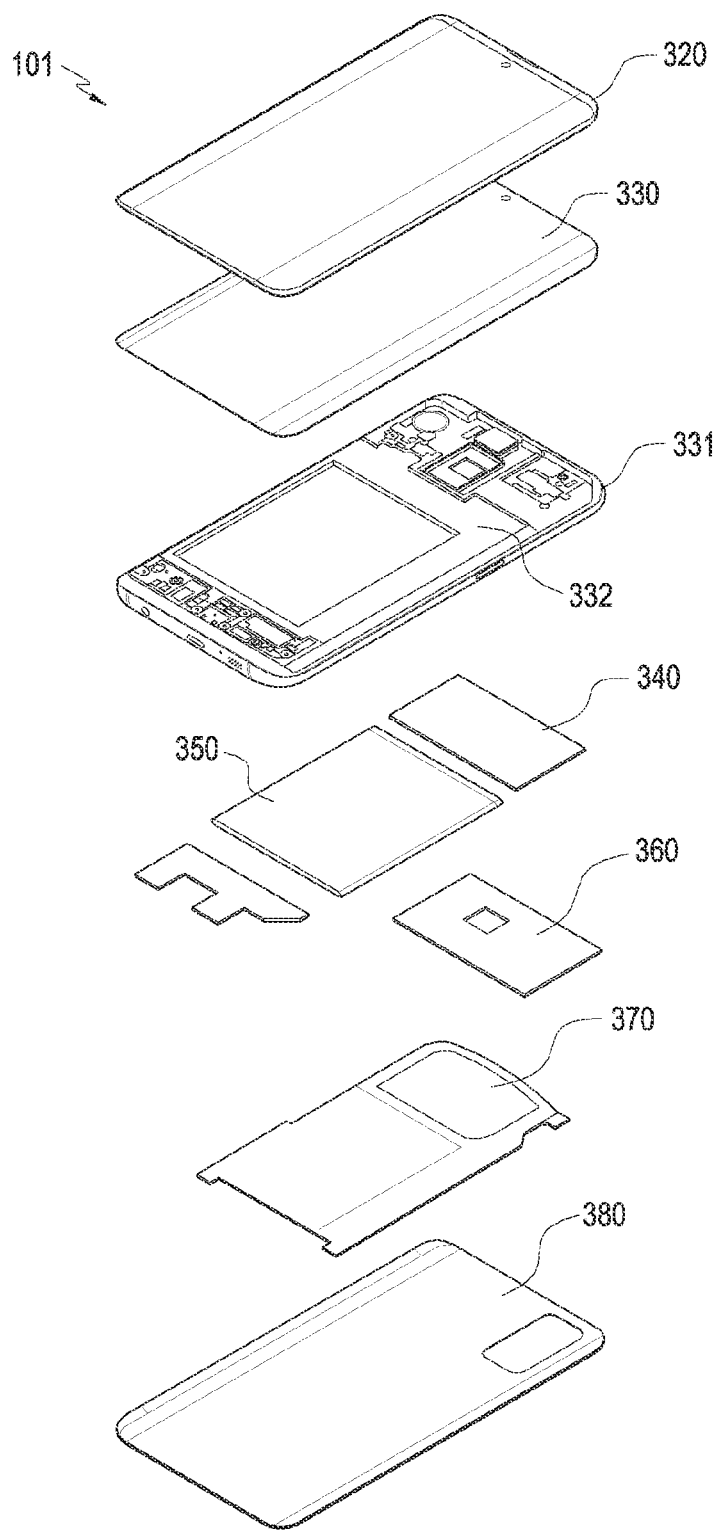
FIG. 4 is an exploded perspective view illustrating an electronic device according to various embodiments.

FIG. 4 is an exploded perspective view illustrating an electronic device according to various embodiments.

Referring to FIG. 4, according to various embodiments, an electronic device 101 (e.g., the electronic device 101 of FIGS. 1 to 3) may include a side bezel structure 331 (e.g., the side bezel structure 318 of FIG. 2), a first supporting member (e.g., support) 332, a front plate 320 (e.g., the front plate 302 of FIG. 2), a display 330 (e.g., the display 301 of FIG. 2), a printed circuit board 340 (e.g., a PCB, flexible PCB (FPCB), or rigid flexible PCB (RFPCB)), a battery 350 (e.g., the battery 189 in FIG. 1), a second supporting member (e.g., second support) 360 (e.g., a rear case), an antenna 370 (e.g., the antenna module 197 of FIG. 1), and a rear plate 380 (e.g., the rear plate 311 of FIG. 2). According to an embodiment, the electronic device 101 may exclude at least one (e.g., the first supporting member 332 or second supporting member 360) of the components or may add other components. At least one of the components of the electronic device 101 may be the same or similar to at least one of the components of the electronic device 101 of FIG. 2 or 3 and no duplicate description is made below.

According to an embodiment, the first supporting member 332 may be disposed inside the electronic device 101 to be connected with the side bezel structure 331 or integrated with the side bezel structure 331. The first supporting member 332 may be formed of, e.g., a metal and/or non-metallic material (e.g., polymer). The display 330 may be joined onto one surface of the first supporting member 332, and the printed circuit board 340 may be joined onto the opposite surface of the first supporting member 311.

According to various embodiments, a processor, a memory, and/or an interface may be mounted on the printed circuit board 340. The processor may include various processing circuitry including one or more of, e.g., a central processing unit, an application processor, a graphic processing device, an image signal processing, a sensor hub processor, or a communication processor. According to various embodiments, the printed circuit board 340 may include a flexible printed circuit board type radio frequency cable (FRC). For example, the printed circuit board 340 may be disposed on at least a portion of the first supporting member 332 and may be electrically connected with an antenna module (e.g., the antenna module 197 of FIG. 1) and a communication module (e.g., the communication module 190 of FIG. 1).

According to an embodiment, the memory may include, e.g., a volatile or non-volatile memory.

According to an embodiment, the interface may include, for example, a high-definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment, the battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to various embodiments, the second supporting member 360 (e.g., a rear case) may be disposed between the printed circuit board 340 and the antenna 370. For example, the second supporting member 360 may include one surface to which at least one of the printed circuit board 340 and the battery 350 is coupled, and another surface to which the antenna 370 is coupled.

According to an embodiment, the antenna 370 may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to an embodiment, an antenna structure may be formed by a portion or combination of the side bezel structure 331 and/or the first supporting member 332.

According to various embodiments, the rear plate 380 may form at least a portion of the rear surface (e.g., the second surface 310B of FIG. 3) of the electronic device 101.

Figure 5:
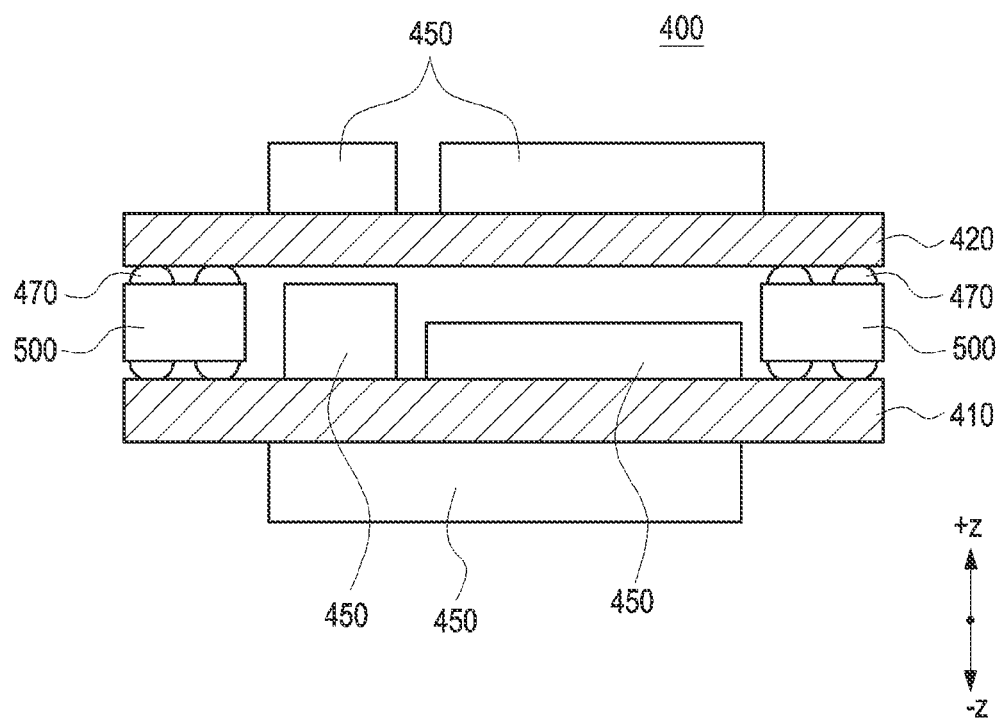
FIG. 5 is a diagram illustrating an example stacking structure of a circuit board module according to various embodiments.

FIG. 5 is a diagram illustrating an example stacking structure of a circuit board module according to various embodiments.

According to various embodiments, an electronic device (e.g., the electronic device 101 of FIGS. 1 to 4) may include a housing (e.g., the housing 310 of FIGS. 2 to 3), a display (e.g., the display 330 of FIG. 4), and a circuit board module 400. The circuit board module 400 may include a first circuit board 410, a second circuit board 420, an interposer 500 disposed between the first circuit board 410 and/or the second circuit board 420, and components 450 mounted on the first circuit board 410 and/or the second circuit board 420.

According to an embodiment, the circuit board module 400 of FIG. 5 may be wholly or partially identical or similar in configuration to the printed circuit board 340 of FIG. 4.

In FIG. 5, 7' may refer to a thickness direction of the circuit board module 400. Further, in an embodiment, '+Z' may refer to a front direction (e.g., a first direction) in which the circuit board module 400 faces the display (e.g., the display 330 of FIG. 4), and '−Z' may refer to a rear direction (e.g., a second direction) in which the circuit board module 400 faces the rear plate (e.g., the rear plate 380 of FIG. 4).

According to various embodiments, the circuit board module 400 may include a plurality of stacked circuit boards. In each circuit board, at least one conductive layer and at least one dielectric layer may be alternately stacked.

According to an embodiment, in the circuit board module 400, the second circuit board 420 is stacked on the first circuit board 410, and the interposer 500 may be disposed between the first circuit board 410 and the second circuit board 420 to provide a space.

According to an embodiment, the first circuit board 410 may be disposed under the display (e.g., the display 330 of FIG. 4), and at least one component 450 may be disposed on at least one surface of the first circuit board 410. The at least one component 450 may be a heat source generating heat, e.g., a power management integrated circuit (PMIC), a power amplifier (PAM), an application processor (AP), a communication processor (CP), a charger integrated circuit (IC), a display driver integrated circuit (DDI), or a communication circuit (e.g., a transceiver, an active communication device, or a passive communication device).

According to an embodiment, the second circuit board 420 may be disposed between the display (e.g., the display 330 of FIG. 4) and the first circuit board 410, and may be a designated interval spaced apart from the first circuit board 410 by the interposer 500. At least one component may be disposed on at least one surface of the second circuit board 420. The at least one component may include, e.g., at least one of a PMIC, PAM, AP, CP, charger IC, or DDI.

According to an embodiment, components 450 may be disposed on one surface of the first circuit board 410 facing in the first direction (+Z-axis direction) or one surface facing in the second direction (−Z-axis direction). The components 450 may be disposed on one surface of the second circuit board 420 facing in the first direction (+Z-axis direction) or on one surface facing in the second direction (−Z-axis direction). According to the present embodiment, it is possible to efficiently use the internal mounting space of the electronic device by expanding the space where the components are disposed on the upper or lower surface of each of the stacked circuit boards.

According to an embodiment, the interposer 500 may be disposed between the first circuit board 410 and the second circuit board 420. For example, the interposer 500 may include a plurality of parts, but may be manufactured overall in a single closed loop shape. The first circuit board 410 may be disposed on one surface of the interposer 500 facing in the second direction (−Z-axis direction), and the second circuit board 420 may be disposed on one surface of the interposer 500 facing in the first direction (+Z-axis direction). According to an embodiment, at least a portion of the interposer 500 may be disposed along the edge of the first circuit board 410 and/or the second circuit board 420. According to an embodiment, at least a portion of the interposer 500 may be disposed across a central area of the first circuit board 410 and/or the second circuit board 420 or may be disposed adjacent to the central area.

According to an embodiment, the interposer 500 may be formed to surround at least two sides of a component positioned on the first circuit board 410 and/or the second circuit board 420. For example, if the at least one component 450 is disposed on the upper surface (the surface facing in the first direction (+Z-axis direction)) of the first circuit board 410 or on the lower surface (the surface facing in the second direction (−Z-axis direction)) of the second circuit board 420, the interposer 500 may be disposed to surround the components and may not be exposed to the outside. According to an embodiment, the upper surface (the surface facing in the first direction (+Z-axis direction)) of the interposer 500 may be joined to the second circuit board 420 using solder 470, and the lower surface (the surface facing in the second direction (−Z-axis direction)) of the interposer 500 may be joined to the first circuit board 410 using solder 470.

According to an embodiment, the interposer 500 may include a plurality of parts, and the plurality of parts may be connected to each other. This is described in greater detail below.

Figure 6A:
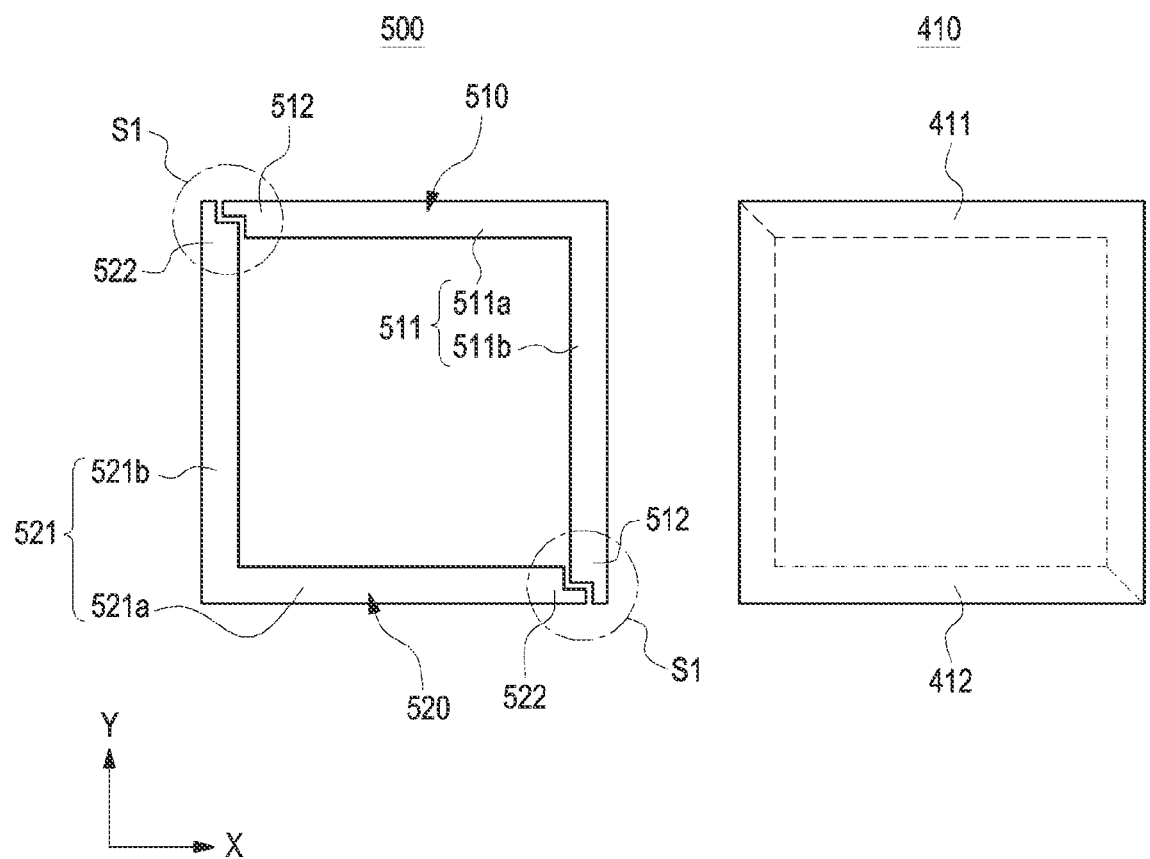
FIG. 6A and FIG. 6B are top or bottom views, respectively, illustrating a first circuit board and an interposer of a circuit board module according to various embodiments.
Figure 6B:
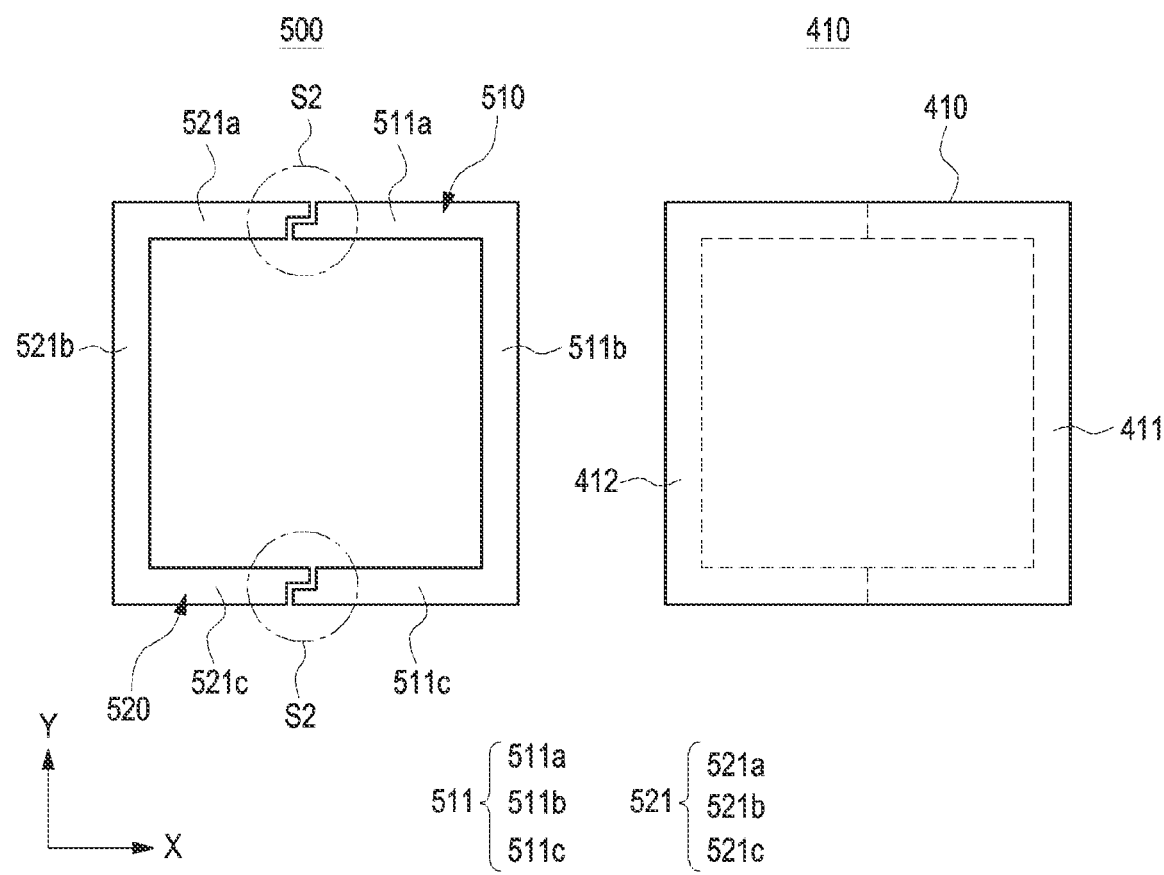

FIG. 6A and FIG. 6B are top and bottom views, respectively, illustrating a first circuit board and an interposer of a circuit board module according to various embodiments.

According to various embodiments, the electronic device (e.g., the electronic device 101 of FIGS. 1 to 4) may include the first circuit board 410, the second circuit board (e.g., the second circuit board 420 of FIG. 5), and the interposer 500 disposed between the first circuit board 410 and the second circuit board 420. According to an embodiment, the configuration of the first circuit board 410, the second circuit board 420, and the interposer 500 of FIGS. 6A and 6B may be identical in whole or part to the configuration of the first circuit board 410, the second circuit board 420, and the interposer 500 of FIG. 5.

According to various embodiments, the interposer 500 may include a plurality of interposer portions. The interposer 500 may include a first interposer portion 510 and a second interposer portion 520. The first interposer portion 510 may be disposed along a first area 411 of the first circuit board 410, and the second interposer portion 520 may be disposed along a second area 412 of the first circuit board 410 adjacent to the first area 411. According to an embodiment, the first area 411 and/or the second area 412 may be an edge area of the first circuit board 410. According to an embodiment, the first area 411 and/or the second area 412 may be a central area or an area adjacent to the center of the first circuit board 410.

According to an embodiment, the first interposer portion 510 may include a line portion 511 having a straight line shape and two opposite ends 512 for connecting to the second interposer portion 520 or another interposer portion. For example, the first area 411 of the first circuit board 410 may be manufactured to have a substantially straight line shape, and the line portion 511 may be provided in a shape corresponding to the first area 411 and joined through solder. As another example, the cross-sectional shape of the two opposite ends 512 may be manufactured in a shape having a flat surface or a stepped surface. However, the shape of the line portion 511 and the two opposite ends 512 of the first interposer portion 510 is not limited thereto, and may be changed in design into various shapes corresponding to the ends of another interposer portion and the first circuit board 410.

According to an embodiment, the second interposer portion 520 may include a line portion 521 having a straight line shape and two opposite ends 522 for connecting to the first interposer portion 510 or another interposer portion. For example, the second area 412 of the first circuit board 410 may be manufactured to have a substantially straight line shape, and the line portion 522 may be provided in a shape corresponding to the second area 412 and joined through solder. As another example, the cross-sectional shape of the two opposite ends 522 may be manufactured in a shape having a flat surface or a stepped surface. However, the shape of the line portion 521 and the two opposite ends 522 of the second interposer portion 520 is not limited thereto, and may be changed in design into various shapes corresponding to the ends of another interposer portion and the first circuit board 410.

Referring to FIG. 6A, the interposer 500 has a rectangular closed curve shape, and may include a first interposer portion 510 and a second interposer portion 520 connected to each other near corners. The first interposer portion 510 may include a 1-1st line portion 511a extending along the X-axis direction and a 1-2nd line portion 511b extending from the 1-1st line portion 511a and formed along the Y-axis direction. For example, the arrangement direction of the 1-1st line portion 511a and the arrangement direction of the 1-2nd line portion 511b may be perpendicular to each other. As another example, the first interposer portion 510 may have an inverted "L" shape. The second interposer portion 520 may include a 2-1st line portion 521a extending along the X-axis direction and a 2-2nd line portion 521b extending from the 2-1st line portion 521a and formed along the Y-axis direction. For example, the arrangement direction of the 2-1st line portion 521a and the arrangement direction of the 2-2nd line portion 521b may be perpendicular to each other. As an example, the second interposer portion 520 may have an "L" shape. According to various embodiments, one end of the 1-1st line portion 511a may be disposed to face one end of the 2-2nd line portion 521b, and one end of the 1-2nd line portion 511b may be disposed to face one end of the 2-1st line portion 521a. According to an embodiment, the end of the 1-1st line portion 511a may be connected to the end of the 2-2nd line portion 521b, and the end of the 1-2nd line portion 511b may be connected to the end of the 2-1st line portion 521a.

Referring to FIG. 6B, the interposer 500 has a rectangular closed curve shape, and may include a first interposer portion 510 and a second interposer portion 520 connected to each other near straight lines. The first interposer portion 510 may include a 1-1st line portion 511a extending along the X-axis direction, a 1-2nd line portion 511b extending from the 1-1st line portion 511a and formed along the Y-axis direction, and a 1-3rd line portion 511c extending from the 1-2nd line portion 511b and formed along the X-axis direction. For example, the first interposer portion 510 may be shaped as "⊐". The second interposer portion 520 may include a 2-1st line portion 521a extending along the X-axis direction, a 2-2nd line portion 521b extending from the 2-1st line portion 521a and formed along the Y-axis direction, and a 2-3rd line portion 521c extending from the 2-2nd line portion 521b and formed along the X-axis direction. As an example, the second interposer portion 520 may have a "U" shape. According to an embodiment, an end of the 1-1st line portion 511a may be disposed to face an end of the 2-1st line portion 521a, and an end of the 1-3rd line portion 511c may be disposed to face the end of the 2-3rd line portion 521c. According to an embodiment, an end of the 1-1st line portion 511a may be connected to an end of the 2-1st line portion 521a, and an end of the 1-3rd line portion 511c may be connected with an end of the 2-3rd line portion 521c.

Figure 7A:
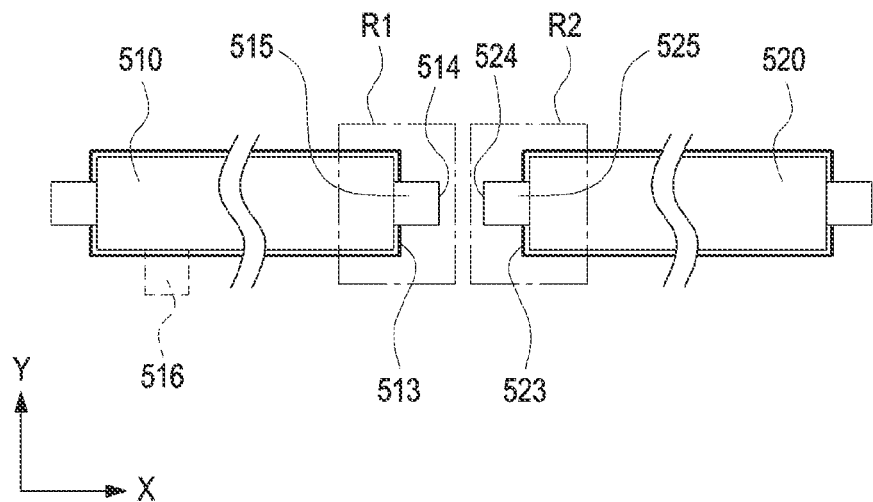
FIG. 7A is an enlarged view illustrating an example shape of one side of an interposer, according to various embodiments; 7B is a perspective view illustrating a plurality of interposers arranged on a raw plate material of a printed circuit board used for manufacturing an interposer, according to various embodiments.
Figure 7B:
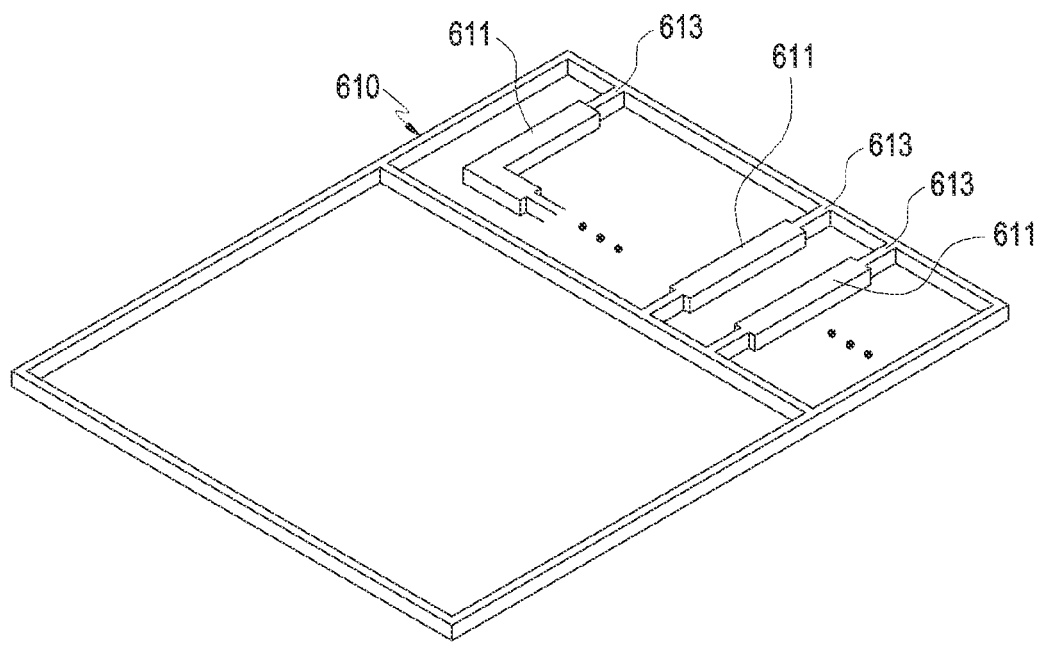
FIG. 7C is a perspective view illustrating a plurality of interposers arranged on a raw plate material of a printed circuit board in a conventional interposer manufacturing process.
Figure 7C:
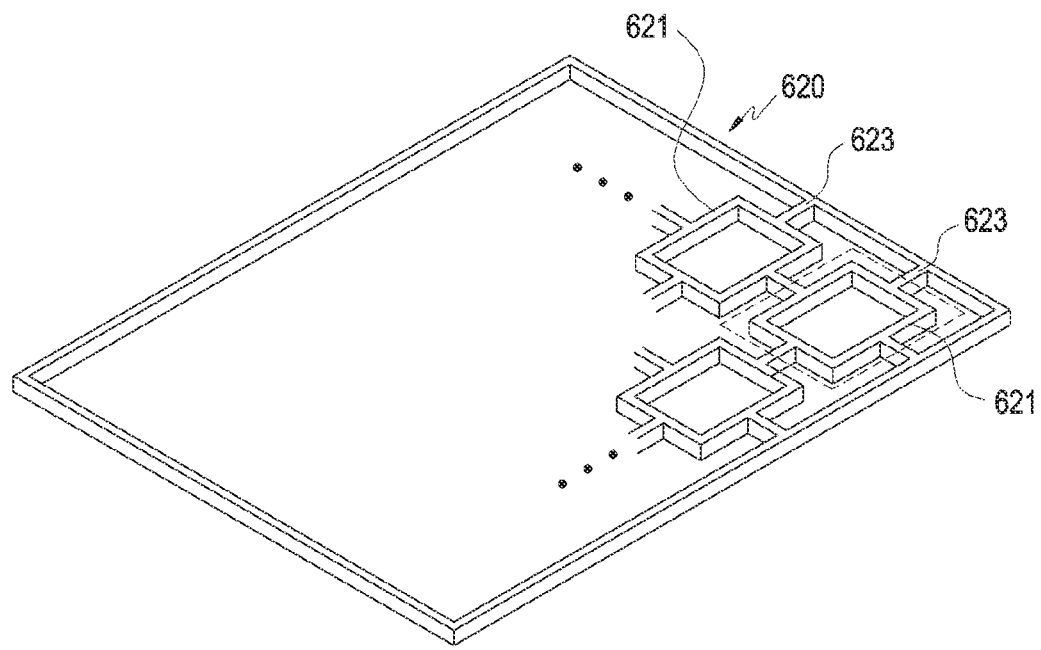

FIG. 7A is an enlarged view illustrating an example shape of one side of an interposer according to various embodiments. FIG. 7A is an enlarged view illustrating the area S1 of FIG. 6A and/or the area S2 of FIG. 6B. FIG. 7B is a perspective view illustrating a plurality of interposers arranged on a raw plate material 610 of a printed circuit board used for manufacturing interposers, according to various embodiments. FIG. 7C is a perspective view illustrating a plurality of interposers arranged on a raw plate material 620 of a printed circuit board in a conventional interposer manufacturing process.

According to various embodiments, the interposer 500 may include a plurality of interposer portions. The interposer 500 may include a first interposer portion 510 and a second interposer portion 520, and a first end R1 of the first interposer portion 510 and a second end R2 of the second interposer portion 520 may be shaped to correspond to each other and be disposed to face each other. The first end R1 of the first interposer portion 510 of FIG. 7 or the second end R2 of the second interposer portion 520 may be one of two opposite ends 512 of the first interposer portion 510 of FIGS. 6A and 6B or two opposite ends 522 of the second interposer portion 520.

According to various embodiments, one surface of the first end R1 of the first interposer portion 510 and one surface of the second end R2 of the second interposer portion 520 that face each other include a flat area. For example, the flat area of the first end R1 and the flat area of the second end R2 may be spaced apart from each other by a designated distance or more. The designated distance may, for example, be at least 0.3 mm or more. As another example, the designated distance may, for example, be about 0.3 mm to 0.6 mm.

According to various embodiments, the first end R1 of the first interposer portion 510 may include a shielding area 513 and a non-shielding area 514. For example, the first end R1 of the first interposer portion 510 may include a portion facing the second interposer portion 520, and an edge area of the portion may be plated for shielding, and a central area of the portion may be excluded from plating for shielding. As another example, the first end R1 of the first interposer portion 510 may include a portion facing the second interposer portion 520, and a portion of the portion may include a masking recess created in a masking process.

According to various embodiments, the first interposer portion 510 may include a first dummy 515 protruding from one area of the first end R1. For example, the first end R1 of the first interposer portion 510 may include a portion facing the second interposer portion 520, and the central area of the portion may include a first dummy 515 formed to protrude toward the second interposer portion 520. According to an embodiment, plating for shielding may be excluded from the first dummy 515. The first interposer portion 510 may require a bridge (e.g., the dummy 613 of FIG. 7B) for supporting the plurality of interposers (e.g., the interposers 611 of FIG. 7B) on the raw plate material 610 of the printed circuit board and moving and/or plating in the process, and the dummy may be located in the area of the first end R1 of the first interposer portion 510. If the movement and/or plating process of the first interposer portion 510 is completed, the dummy may be partially removed. Since the plating process is performed, with the first dummy 515 connected with the raw plate material 610 of printed circuit board or other interposers (e.g., the interposers 613 of FIG. 7B), the first dummy 515 may be excluded from plating in the plating process.

According to an embodiment, in addition to the first dummy 515 protruding from the first end R1 in the X-axis direction, the first interposer portion 510 may include a dummy 516 protruding in the Y-axis direction (e.g., to the inside and/or outside of the interposer 500) perpendicular to the X-axis direction from one side of the line portion (e.g., the line portion 511 of FIG. 6A or 6B).

According to various embodiments, the second end R2 of the second interposer portion 520 may include a shielding area 523 and a non-shielding area 524. For example, the second end R2 of the second interposer portion 520 may include a portion facing the first interposer portion 510, and an edge area of the portion may be plated for shielding, and a central area of the portion may be excluded from plating for shielding. As another example, the second end R2 of the second interposer portion 520 may include a portion facing the first interposer portion 510, and a portion of the portion may include a masking recess created in a masking process.

According to various embodiments, the second interposer portion 520 may include a second dummy 525 protruding from one area of the second end R2. For example, the second end R2 of the second interposer portion 520 may include a portion facing the first interposer portion 510, and the central area of the portion may include a second dummy 525 formed to protrude toward the first interposer portion 510. According to an embodiment, plating for shielding may be excluded from the second dummy 525. The second interposer portion 520 may require a bridge (e.g., the dummy 613 of FIG. 7B) for supporting the plurality of interposers (e.g., the interposers 611 of FIG. 7B) on the raw plate material 610 of the printed circuit board and moving and/or plating in the process, and the dummy may be located in the area of the second end R2 of the second interposer portion 520. If the movement and/or plating process of the second interposer portion 520 is completed, the dummy may be partially removed. Since the plating process is performed, with the second dummy 525 connected with the raw plate material 610 of printed circuit board or other interposers (e.g., the interposers 613 of FIG. 7B), the second dummy 525 may be excluded from plating in the plating process.

In general, the interposer (e.g., the interposer 621 of FIG. 7C) may be manufactured in the form of one closed loop according to the shape of the electronic device/circuit board module. Accordingly, for the movement and/or plating process of the interposer 621, the dummy 623 for grip is formed to protrude only in the internal/external direction, and the dummy 623 may be excluded during the plating process. The interposer may be vulnerable to shielding as side plating, which is essential for shielding from the outside, is partially cut off in the dummy area. An interposer (e.g., the interposer 500 or 611 of FIGS. 7A and 7B) according to the disclosure uses separated interposer portions and, as the first dummy 515 (e.g., the dummy 613 of FIG. 7B) and/or the second dummy 525 (e.g., the dummy 613 of FIG. 7B) is formed on the boundary surfaces of, e.g., a first interposer portion 510 and a second interposer portion, the plating formed along the outer surface may not be broken. Accordingly, it is possible to enhance EMI/EMC performance.

Figure 8:
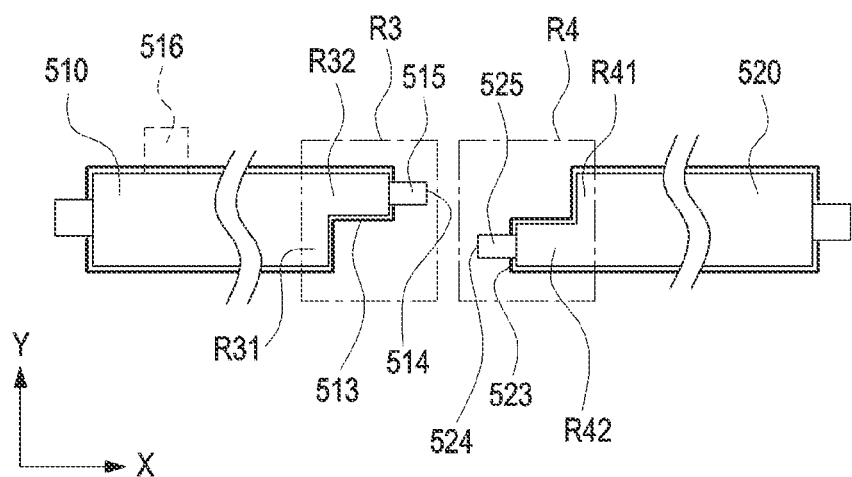
FIG. 8 is an enlarged view illustrating the shape of one side of an interposer, according to various embodiments.

FIG. 8 is an enlarged view illustrating an example shape of one side of an interposer, according to various embodiments. FIG. 8 is an enlarged view illustrating the area S1 of FIG. 6A and/or the area S2 of FIG. 6B.

According to various embodiments, the interposer 500 may include a plurality of interposer portions. The interposer 500 may include a first interposer portion 510 and a second interposer portion 520, and a third end R3 of the first interposer portion 510 and a fourth end R4 of the second interposer portion 520 may be shaped to correspond to each other and be disposed to face each other. The third end R3 of the first interposer portion 510 of FIG. 8 or the fourth end R4 of the second interposer portion 520 may be one of two opposite ends 512 of the first interposer portion 510 of FIGS. 6A and 6B or two opposite ends 522 of the second interposer portion 520.

According to various embodiments, one surface of the third end R3 of the first interposer portion 510 and one surface of the fourth end R4 of the second interposer portion 520 may be shaped to have steps and fitted together. For example, the third end R3 may include a 3-1st end R31 and a 3-2nd end R32 protruding from the 3-1st end R31. The fourth end R4 may include a 4-1st end R41 and a 4-2nd end R42 protruding from the 4-1st end R41. According to various embodiments, the 3-1st end R31 and the 4-2nd end R42 may face each other and may be spaced apart from each other by a designated distance or more. The 3-2nd end R32 and the 4-1st end R41 may face each other and may be spaced apart from each other by a designated distance or more. According to an embodiment, the 3-2nd end R32 and the 4-2nd end R42 may face each other and may be spaced apart from each other by a designated distance or more. The designated distance may be at least 0.3 mm or more. As another example, the designated distance may be 0.3 mm to 0.6 mm.

According to various embodiments, if viewed from the side of the first interposer portion 510 or the second interposer portion 520, they may at least partially overlap each other. For example, the 3-2nd end R32 of the first interposer portion 510 and the 4-2nd end of the second interposer portion 520 may overlap each other.

According to various embodiments, the third end R3 of the first interposer portion 510 may include a shielding area 513 and a non-shielding area 514. For example, the 3-2nd end R32 of the first interposer portion 510 may include a portion facing the second interposer portion 520, and an edge area of the portion may be plated for shielding, and a central area of the portion may be excluded from plating for shielding. The 3-1st end R31 of the first interposer portion 510 may be entirely plated for shielding. As another example, the third end R3 of the first interposer portion 510 may include a portion facing the second interposer portion 520, and a portion of the portion may include a masking recess created in a masking process.

According to various embodiments, the first interposer portion 510 may include a third dummy 515 protruding from one area of the third end R3. For example, the 3-2nd end R32 of the first interposer portion 510 may include a portion facing the 4-1st end R41 of the second interposer portion 520, and the central area of the portion may include a third dummy 515 formed to protrude toward the second interposer portion 520. According to an embodiment, plating for shielding may be excluded from the third dummy 515. The first interposer portion 510 needs a handle (e.g., a dummy) to be gripped from the outside for movement and/or a plating process, and the dummy may be positioned in the area of the 3-2nd end R32 of the first interposer portion 510. If the movement and/or plating process is completed, the dummy may be partially removed. Since the plating process is performed, with the third dummy 515 gripped by the user or an external object, the third dummy 515 may be excluded from plating in the plating process.

According to an embodiment, in addition to the third dummy 515 protruding from the third end R3 in the X-axis direction, the first interposer portion 510 may include a dummy 516 protruding in the Y-axis direction (e.g., to the inside and/or outside of the interposer 500) perpendicular to the X-axis direction from one side of the line portion (e.g., the line portion 511 of FIG. 6A or 6B).

According to various embodiments, the fourth end R4 of the second interposer portion 520 may include a shielding area 523 and a non-shielding area 524. For example, the 4-2nd end R42 of the second interposer portion 520 may include a portion facing the first interposer portion 510, and an edge area of the portion may be plated for shielding, and a central area of the portion may be excluded from plating for shielding. The 4-1st end R41 of the second interposer portion 520 may be entirely plated for shielding. As another example, the fourth end R4 of the second interposer portion 520 may include a portion facing the first interposer portion 510, and a portion of the portion may include a masking recess created in a masking process.

According to various embodiments, the second interposer portion 520 may include a fourth dummy 525 protruding from one area of the fourth end R4. For example, the 4-2nd end R42 of the second interposer portion 520 may include a portion facing the 3-1st end R31 of the first interposer portion 510, and the central area of the portion may include a fourth dummy 525 formed to protrude toward the first interposer portion 510. According to an embodiment, plating for shielding may be excluded from the fourth dummy 525. The second interposer portion 520 needs a handle (e.g., a dummy) to be gripped from the outside for movement and/or a plating process, and the dummy may be positioned in the area of the 4-2nd end R42 of the second interposer portion 520. If the movement and/or plating process is completed, the dummy may be partially removed. Since the plating process is performed, with the dummy gripped by the user or an external object, the dummy may be excluded from plating in the plating process.

Figure 9:
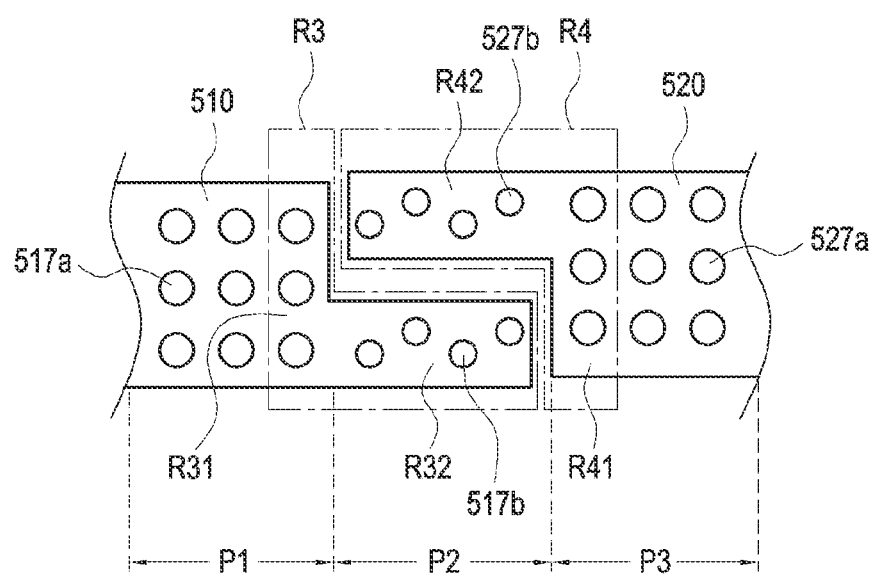
FIG. 9 is an enlarged view illustrating a partial area of an interposer viewed from above according to various embodiments.

FIG. 9 is an enlarged view illustrating a partial area of an interposer viewed from the top according to various embodiments. FIG. 9 is an enlarged view illustrating the area S1 of FIG. 6A and/or the area S2 of FIG. 6B.

According to various embodiments, the interposer 500 may include a plurality of interposer portions. The interposer 500 may include a first interposer portion 510 and a second interposer portion 520, and a third end R3 of the first interposer portion 510 and a fourth end R4 of the second interposer portion 520 may be shaped to correspond to each other and be disposed to face each other. The third end R3 of the first interposer portion 510 of FIG. 9 or the fourth end R4 of the second interposer portion 520 may be one of two opposite ends 512 of the first interposer portion 510 of FIGS. 6A and 6B or two opposite ends 522 of the second interposer portion 520.

According to various embodiments, one surface of the third end R3 of the first interposer portion 510 and one surface of the fourth end R4 of the second interposer portion 520 may be shaped to have steps and fitted together. For example, the third end R3 may include a 3-1st end R31 and a 3-2nd end R32 protruding from the 3-1st end R31. The fourth end R4 may include a 4-1st end R41 and a 4-2nd end R42 protruding from the 4-1st end R41.

According to various embodiments, the interposer 500 may include a P1 area formed only of the first interposer portion 510, a P2 area in which when viewed from the side, the first interposer portion 510 and the second interposer portion 520 overlap each other, and a P3 area formed only of the second interposer portion 520. In the P1 area and/or the P3 area, a plurality of vias 517a and 527a may be arranged in two or three rows. The P2 area may have a width smaller than that of the P1 area and the P3 area. For example, as a portion of the first interposer portion 510 and a portion of the second interposer portion 520 are spaced apart by a predetermined interval, the P2 area may have a width smaller than that of the P1 area and the P3 area. Vias 517b and 527b forming at least one row may be arranged in each of the first interposer portion 510 and the second interposer portion 520 of the P2 area. For example, in the first interposer portion 510, vias 517b may be arranged to form one or two rows, and in the second interposer portion 520, vias 527b may be arranged to form one or two rows to correspond to the vias arranged in the first interposer portion 510. However, the arrangement of the plurality of vias in the P1 area, the P2 area, and the P3 area is an embodiment, and various design changes may be made to the arrangement of the vias, as increasing the number of vias arranged in each area by designing vias smaller in diameter.

In conventional interposers, a dummy protruding outward for movement and/or a plating process is formed, and plating may be excluded from the protruding dummy. As a ground signal is disposed in the portion adjacent to the dummy, the arrangement of vias may be excluded. Since the interposer according to the disclosure uses separated interposer portions and forms a dummy between the interposers, a separate structure for a ground signal is unnecessary, and the arrangement of vias may be increased. Thus, it is possible to enhance the via structure of general signals in the interposer.

FIGS. 10A, 10B, 10C, 10D and 10E are views illustrating various example shapes of an interposer according to various embodiments.

According to various embodiments, the interposers 500a, 500b, 500c, and 500d may include a plurality of interposer portions. The configuration of the interposers 500a, 500b, 500c, and 500d of FIGS. 10A, 10B, 10C, 10D and 10E may be identical in whole or part to the configuration of the interposer 500 of FIGS. 6A and 6B.

Figure 10A:
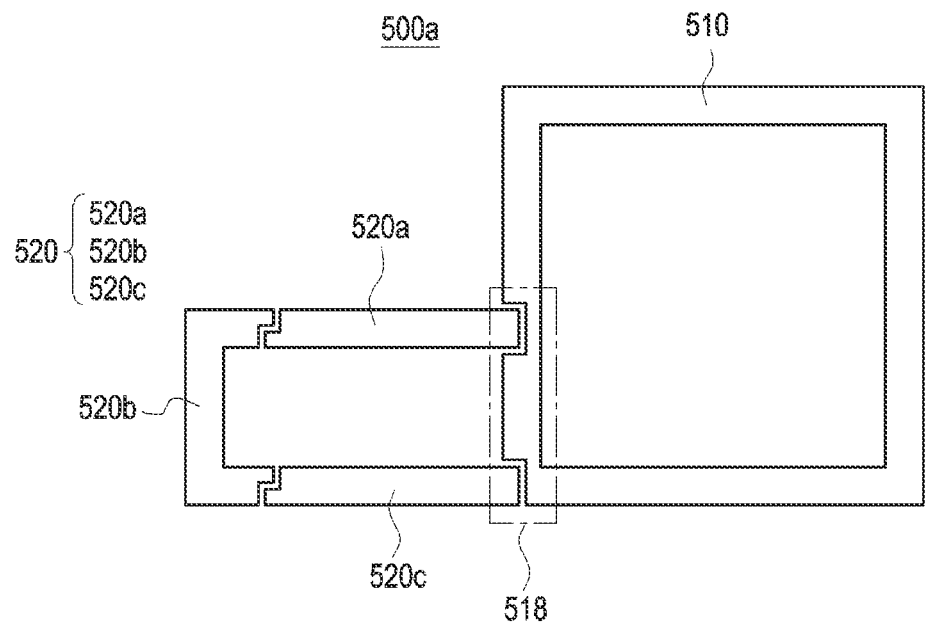
FIGS. 10A, 10B, 10C, 10D and 10E are diagrams illustrating various example shapes of an interposer according to various embodiments.

Referring to FIG. 10A, the interposer 500a may include a first interposer portion 510 manufactured in a rectangular shape and a second interposer portion 520 extending from one side of the first interposer portion 510 and including a plurality of interposer portions.

According to an embodiment, the first interposer portion 510 may be manufactured in a single rectangular closed loop shape. The first interposer portion 510 may include four line portions, and at least one line portion may include a connecting portion 518 for connecting to the second interposer portion 520. The connecting portion 518 may have a recess shape into which at least a portion of an end of the second interposer portion 520 is insertable.

According to an embodiment, the second interposer portion 520 may include three portions. The second interposer portion 520 may include a 2-1st interposer portion 520a, a 2-2nd interposer portion 520b, and a 2-3rd interposer portion 520c. The second interposer portion 520 may be overall shaped as "c" or "⊐" and may be connected to the first interposer portion 510 to form a single rectangular closed loop. For example, the 2-1st interposer portion 520a may include a line portion including a straight line shape and two opposite ends for connecting to the first interposer portion 510 and the 2-2nd interposer portion 520b. The shape of the two opposite ends may be provided in a flat shape and/or a stepped shape. As another example, the 2-2nd interposer portion 520b may include a line portion including a straight line shape and two opposite ends for connecting to the 2-1st interposer portion 520a and the 2-3rd interposer portion 520c. The shape of the two opposite ends may be provided in a flat shape and/or a stepped shape. As another example, the 2-3rd interposer portion 520c may include a line portion including a straight line shape and two opposite ends for connecting to the 2-2nd interposer portion 520b and the first interposer portion 510. The shape of the two opposite ends may be provided in a flat shape and/or a stepped shape. According to an embodiment, the two opposite ends of the 2-1st interposer portion 520a, the 2-2nd interposer portion 520b, and the 2-3rd interposer portion 520c may be connected with the connecting portion 518 of the first interposer 510, forming another rectangular closed loop.

Figure 10B:
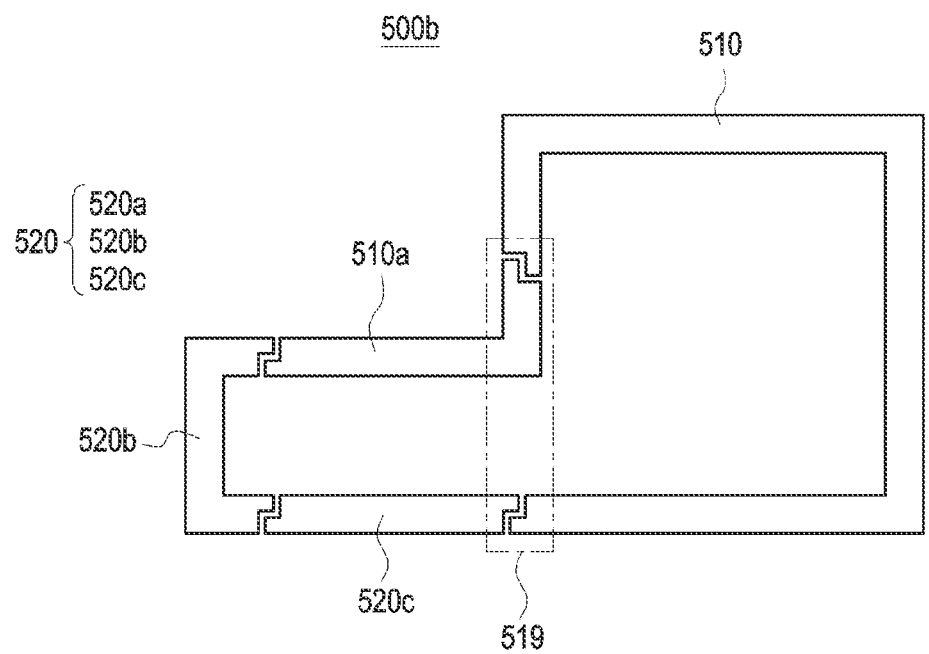

Referring to FIG. 10B, the interposer 500b may include a first interposer portion 510 and a second interposer portion 520 manufactured in a closed loop shape.

According to an embodiment, the first interposer portion 510 may be manufactured in a rectangular loop shape with one side open. The first interposer portion 510 may include four line portions, and one side of the two line portions may include a connecting portion 519 to be connected with the second interposer portion 520.

According to an embodiment, the second interposer portion 520 may be connected to the first interposer portion 510 to form one loop. The second interposer portion 520 may be manufactured overall in a shape with one side open and may be formed in an area smaller than the area formed by the first interposer portion 510. The second interposer portion 520 may include three portions. The second interposer portion 520 may include a 2-1st interposer portion 520a, a 2-2nd interposer portion 520b, and a 2-3rd interposer portion 520c. For example, the 2-1st interposer portion 520a may include a line portion including a straight line shape and two opposite ends for connecting to the first interposer portion 510 and the 2-2nd interposer portion 520b. The 2-1st interposer portion 510a may be shaped to be at least partially bent in an inverted "L" shape or an "L" shape. The shape of the two opposite ends may be provided in a flat shape and/or a stepped shape. As another example, the 2-2nd interposer portion 520b may include a line portion including a straight line shape and two opposite ends for connecting to the 2-1st interposer portion 520a and the 2-3rd interposer portion 520c. The 2-2nd interposer portion 520b may be at least partially bent to overall form a "U" shape. The shape of the two opposite ends may be provided in a flat shape and/or a stepped shape. As another example, the 2-3rd interposer portion 520c may include a line portion including a straight line shape and two opposite ends for connecting to the 2-2nd interposer portion 520b and the first interposer portion 510. The shape of the two opposite ends may be provided in a flat shape and/or a stepped shape.

Figure 10C:
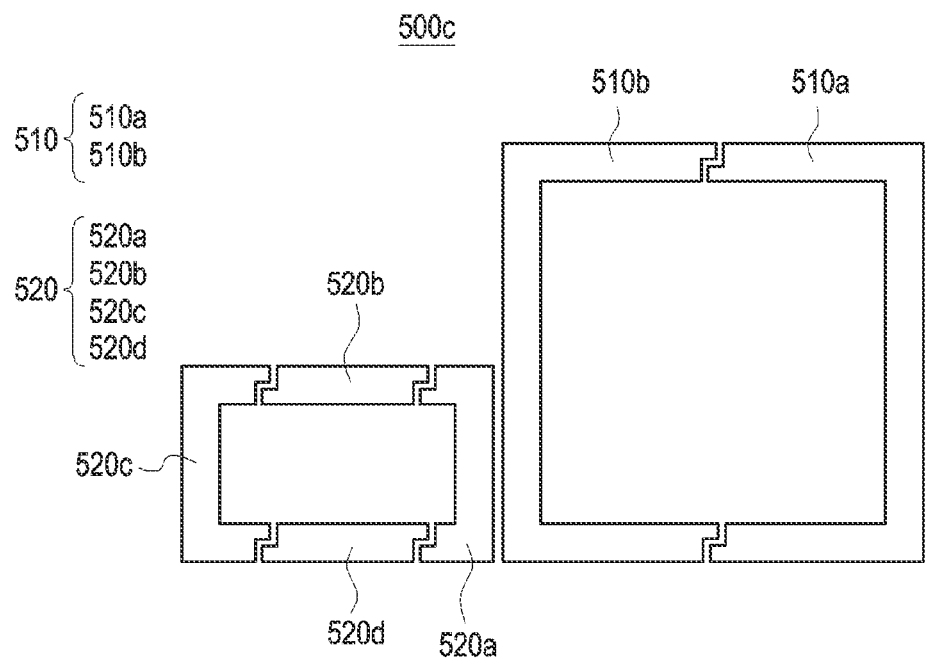

Referring to FIG. 10C, an interposer 500c may include a first interposer portion 510 manufactured in one closed loop shape and a second interposer portion 520 disposed adjacent to the first interposer portion 510 and manufactured in another closed loop shape.

According to an embodiment, the first interposer portion 510 may be manufactured in a single rectangular closed loop shape. The first interposer portion 510 may include two portions. The first interposer portion 510 may include a 1-1st interposer portion 510a and a 1-2nd interposer portion 510b. The 1-1st interposer portion 510a may include three line portions, and may include two opposite ends to be connected to the 1-2nd interposer portion 510b. The 1-2nd interposer portion 510b may include three line portions, and may include two opposite ends to be connected to the 1-1th interposer portion 510a. The 1-1st interposer portion 510a and the 1-2nd interposer portion 510b may be manufactured in shapes corresponding to each other. The shape of each of the two opposite ends may be provided in a flat shape and/or a stepped shape.

According to an embodiment, the second interposer portion 520 may be manufactured in a single rectangular closed loop shape. The area surrounded by the second interposer portion 520 may be different from the area surrounded by the first interposer portion 510. The second interposer portion 520 may include four portions. The second interposer portion 520 may include a 2-1st interposer portion 520a, a 2-2nd interposer portion 520b, a 2-3rd interposer portion 520c, and a 2-4th interposer portion 520d. The 2-1st interposer portion 520a and the 2-3rd interposer portion 520c may include third line portions and may include two opposite ends for connecting to the 2-2nd interposer portion 520b and the 2-4th interposer portion 520d. The shape of each of the two opposite ends may be provided in a flat shape and/or a stepped shape. The 2-2nd interposer portion 520b and the 2-4th interposer portion 520d may include a line portion including a straight line shape and two opposite ends for connecting to the 2-1st interposer portion 520a and the 2-3rd interposer portion 520c. The shape of the two opposite ends may be provided in a flat shape and/or a stepped shape.

Figure 10D:
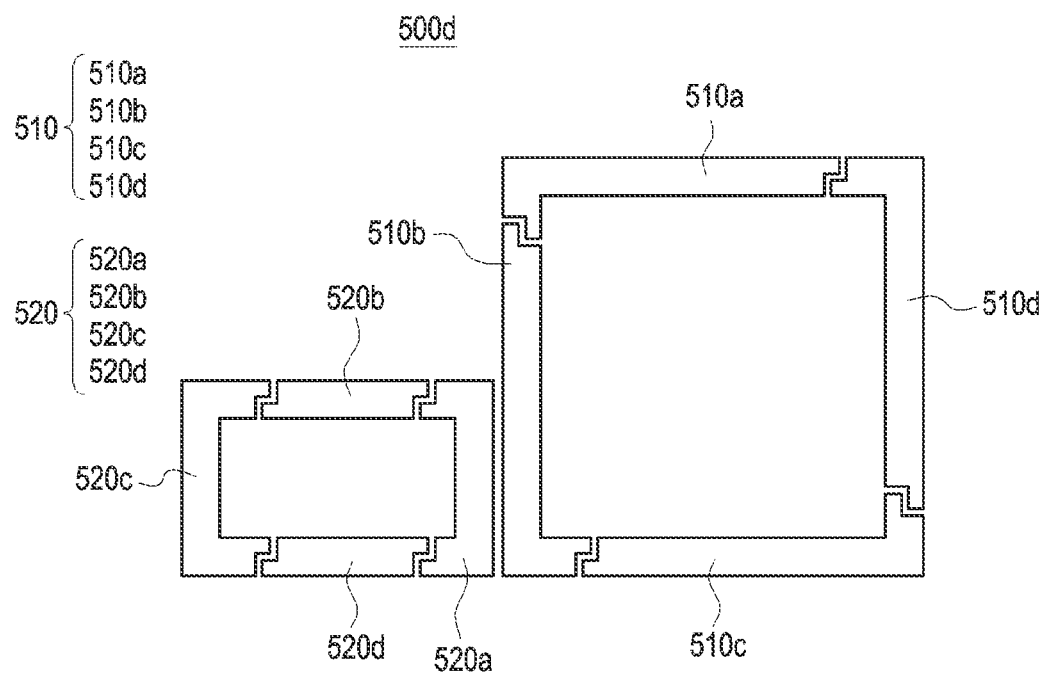

Referring to FIG. 10D, an interposer 500d may include a first interposer portion 510 manufactured in one closed loop shape and a second interposer portion 520 disposed adjacent to the first interposer portion 510 and manufactured in another closed loop shape.

According to an embodiment, the first interposer portion 510 may be manufactured in a single rectangular closed loop shape. The first interposer portion 510 may include four portions. The first interposer portion 510 may include a 1-1st interposer portion 510a, a 1-2nd interposer portion 510b, a 1-3rd interposer portion 510c, and a 1-4th interposer portion 510d connected to each other. Each interposer portion may include two line portions and may include two opposite ends for connecting with the other interposer portions. The shape of each of the two opposite ends may be provided in a flat shape and/or a stepped shape.

According to an embodiment, the second interposer portion 520 may be manufactured in a single rectangular closed loop shape. The area surrounded by the second interposer portion 520 may be different from the area surrounded by the first interposer portion 510. The second interposer portion 520 may include four portions. The second interposer portion 520 may include a 2-1st interposer portion 520a, a 2-2nd interposer portion 520b, a 2-3rd interposer portion 520c, and a 2-4th interposer portion 520d. The 2-1st interposer portion 520a and the 2-3rd interposer portion 520c may include third line portions and may include two opposite ends for connecting to the 2-2nd interposer portion 520b and the 2-4th interposer portion 520d. The shape of each of the two opposite ends may be provided in a flat shape and/or a stepped shape. The 2-2nd interposer portion 520b and the 2-4th interposer portion 520d may include a line portion including a straight line shape and two opposite ends for connecting to the 2-1st interposer portion 520a and the 2-3rd interposer portion 520c. The shape of the two opposite ends may be provided in a flat shape and/or a stepped shape.

Figure 10E:
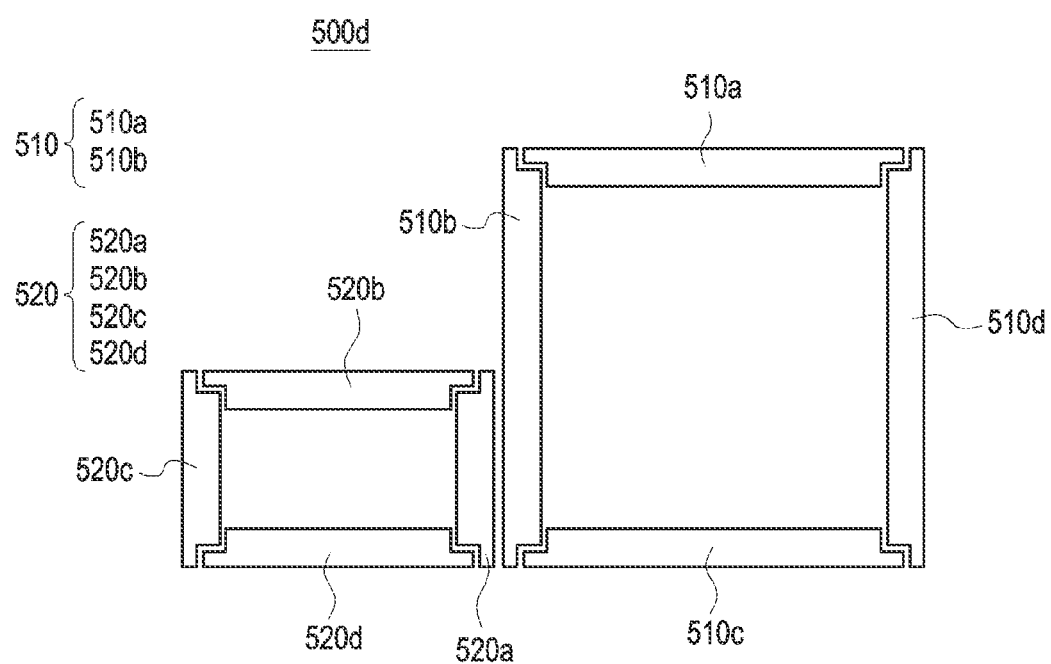

Referring to FIG. 10E, an interposer 500d may include a first interposer portion 510 manufactured in one closed loop shape and a second interposer portion 520 disposed adjacent to the first interposer portion 510 and manufactured in another closed loop shape.

According to an embodiment, the first interposer portion 510 may be manufactured in a single rectangular closed loop shape. The first interposer portion 510 may include four portions. The first interposer portion 510 may include a 1-1st interposer portion 510a, a 1-2nd interposer portion 510b, a 1-3rd interposer portion 510c, and a 1-4th interposer portion 510d connected to each other. The interposer portions each form one straight line portion and may be connected to each other in the corner areas of the square closed loops. Each of the interposer portions may include two opposite ends for connecting to other interposer portions, and the shape of the two opposite ends may be provided in a flat shape and/or a stepped shape.

According to an embodiment, the second interposer portion 520 may be manufactured in a single rectangular closed loop shape. The area surrounded by the second interposer portion 520 may be different from the area surrounded by the first interposer portion 510. The second interposer portion 520 may include four portions. The second interposer portion 520 may include a 2-1st interposer portion 520a, a 2-2nd interposer portion 520*b*, a 2-3rd interposer portion 520*c*, and a 2-4th interposer portion 520*d*. The interposer portions each form one straight line portion and may be connected to each other in the corner areas of the square closed loops. Each of the interposer portions may include two opposite ends for connecting with other interposer portions, and the shape of the two opposite ends may be provided in a flat shape and/or a stepped shape. According to the disclosure, the interposer portions of FIGS. 10A to 10E disclose one of various embodiments and may be changed in design into various structures.

According to various example embodiments, an electronic device (e.g., the electronic device 101 of FIGS. 1 to 4) may comprise: a display (e.g., the display 330 of FIG. 4), a first circuit board (e.g., the first circuit board 410 of FIG. 5) disposed under the display, at least one component (e.g., the component 450 of FIG. 5) disposed on one surface of the first circuit board, an interposer (e.g., the interposer 500 of FIG. 5) surrounding at least two sides of the at least one component and disposed on the first circuit board, and a second circuit board (e.g., the second circuit board 420 of FIG. 5) at least partially spaced apart from the first circuit board and including an area joined with the interposer. The interposer may include: a first interposer portion (e.g., the first interposer portion 510 of FIG. 6A or 6B) disposed along a first area (e.g., the first area 411 of FIG. 6A or 6B) of the first circuit board, a first end (e.g., the first end R1 of FIG. 7 or the third end R3 of FIG. 8) of the first interposer having at least a portion including a non-shielding area, and a second interposer portion (e.g., the second interposer portion 520 of FIG. 6A or 6B) disposed along a second area (e.g., the second area 412 of FIG. 6A or 6B), adjacent to the first area of the first circuit board, a second end (e.g., the second end R2 of FIG. 7 or the fourth end R4 of FIG. 8) of the second interposer facing the first end of the first interposer portion and having at least a portion including a non-shielding area.

According to various example embodiments, the first end of the first interposer portion may include a first dummy (e.g., the first dummy 515 of FIG. 7 or 8) whose central area protrudes toward the second end, and the second end of the second interposer portion may include a second dummy (e.g., the second dummy 525 of FIG. 7 or 8) whose central area protrudes toward the first end.

According to various example embodiments, the first interposer portion may include a line portion (e.g., the line portion 511 of FIG. 6A or 6B) having a straight line shape and two opposite ends (e.g., the two opposite ends 512 of FIG. 6A or 6B) configured to connect with the second interposer portion or another interposer portion.

According to various example embodiments, the first interposer portion may include a first dummy (e.g., the first dummy 515 of FIG. 7 or 8) protruding from the two opposite ends in a first direction and a third dummy (e.g., the first dummy 516 of FIG. 7 or 8) protruding from a side of the line portion in a direction perpendicular to the first direction.

According to various example embodiments, the interposer may be disposed between the first circuit board and the second circuit board and may have a closed loop shape configured to shield a space between the first circuit board and the second circuit board.

According to various example embodiments, when viewed from a side of the interposer, the first end of the first interposer portion and the second end of the second interposer portion may partially overlap each other.

According to various example embodiments, the first end of the first interposer portion may include a first first end (e.g., R31 of FIG. 8) and a second first end (e.g., R32 of FIG. 8) protruding from the first first end, and the second end of the second interposer portion may include a first second end (e.g., R41 of FIG. 8) and a second second end (e.g., R42 of FIG. 8) protruding from the first second end. The first first end may face the second second end and be spaced apart from the second second end by a designated distance or more. The second first end may face the first second end and be spaced apart from the first second end by a designated distance or more.

According to various example embodiments, the first interposer portion may include a first dummy (e.g., the first dummy 515 of FIG. 8) protruding from an area of the second first end to the first second end, and the second interposer portion may include a second dummy (e.g., the second dummy 525 of FIG. 8) protruding from an area of the second second end to the first first end.

According to various example embodiments, the designated distance may be about 0.3 mm to 0.6 mm. When viewed from a side of the first interposer portion or the second interposer portion, the second first end and the second second end may overlap each other.

According to various example embodiments, the interposer may include a first area (e.g., R1 of FIG. 9) formed as the first interposer portion, a second area (e.g., P2 of FIG. 9) in which the first interposer portion overlaps the second interposer portion, and a third area (e.g., P3 of FIG. 9) formed as the second interposer portion. The first area and/or the third area may include a plurality of vias arranged in two or three rows.

According to various example embodiments, a width of the first area may correspond to a width of the P3 area. Widths of the first interposer portion and the second interposer portion forming the P2 area may be smaller than the width of the P1 area or the P3 area.

According to various example embodiments, in the second area, the first interposer portion may include vias arranged in at least one row, and the second interposer portion may include vias arranged in at least one row to correspond to the vias arranged in the first interposer portion.

According to various example embodiments, a shielding area including a plated film may be disposed around the non-shielding area of the first end. A shielding area including a plated film may be disposed around the non-shielding area of the second end.

According to various example embodiments, the shielding area may surround at least a portion of the non-shielding area.

According to various example embodiments, the electronic device may further comprise a housing (e.g., the housing 310 of FIGS. 2 and 3) including a first space and a second space adjacent to the first space. A circuit board module may be positioned in the first space, and a battery (e.g., the battery 350 of FIG. 4) electrically connected with the circuit board module may be positioned in the second space.

According to various example embodiments, an electronic device (e.g., the electronic device 101 of FIGS. 1 to 4) may comprise: a display (e.g., the display 330 of FIG. 4), a first circuit board (e.g., the first circuit board 410 of FIG. 5) disposed under the display, at least one component (e.g., the component 450 of FIG. 5) disposed on one surface of the first circuit board, a second circuit board (e.g., the second circuit board 420 of FIG. 5) disposed on the first circuit board and spaced apart from the first circuit board, and an interposer (e.g., the interposer 500 of FIG. 5) disposed between the first circuit board and the second circuit board and disposed on the first circuit board surrounding at least two sides of the at least one component. The interposer may include: a first interposer portion (e.g., the first interposer portion 510 of FIG. 6A or 6B) disposed along a first area (e.g., the first area 411 of FIG. 6A or 6B) of the first circuit board and including a first dummy (e.g., the first dummy 515 of FIG. 7 or 8) protruding from an area of a first end in a first direction and a second interposer portion (e.g., the second interposer portion 520 of FIG. 6A or 6B) disposed along a second area (e.g., the second area 412 of FIG. 6A or 6B) of the first circuit board adjacent to the first area and including a second dummy (e.g., the second dummy 525 of FIG. 7 or 8) protruding from an area of a second end, facing the first end, in a second direction opposite to the first direction.

According to various example embodiments, in the first end, a surrounding area other than the first dummy may include a plated film configured to provide shielding and, in the second end, a surrounding area other than the second dummy may include a plated film configured to provide shielding.

According to various example embodiments, the first end may have a stepped shape, and the second step may have a stepped shape accommodating at least a portion of the first end.

According to various example embodiments, an electronic device (e.g., the electronic device 101 of FIGS. 1 to 4) may comprise: a display (e.g., the display 330 of FIG. 4), a first circuit board (e.g., the first circuit board 410 of FIG. 5) disposed under the display, at least one component (e.g., the component 450 of FIG. 5) disposed on one surface of the first circuit board, an interposer (e.g., the interposer 500 of FIG. 5) surrounding at least two sides of the at least one component and disposed on the first circuit board, and a second circuit board (e.g., the second circuit board 420 of FIG. 5) spaced apart from the first circuit board and including an area jointed with the interposer. The interposer may include: a first interposer portion (e.g., the first interposer portion 510 of FIG. 6A or 6B) disposed along a first area of the first circuit board and including a first end and a second interposer portion (e.g., the second interposer portion 520 of FIG. 6A or 6B) disposed along a second area of the first circuit board adjacent to the first area and including a second end at least partially facing the first end. When viewed from a side of the interposer, the first end of the first interposer portion may at least partially overlap the second end of the second interposer portion.

According to various example embodiments, the first end and the second end may be spaced apart from each other by a designated distance or more.

It is apparent to one of ordinary skill in the art that the circuit board module and the electronic device including the same according to various example embodiments as described above are not limited to the above-described embodiments and those shown in the drawings, and various changes, modifications, or alterations may be made thereto without departing from the scope of the disclosure.

What is claimed is:

1. An electronic device, comprising:
a display;
a first circuit board disposed under the display;
at least one component disposed on one surface of the first circuit board;
an interposer surrounding at least two sides of the at least one component and disposed on the first circuit board; and
a second circuit board spaced apart from the first circuit board and including an area joined with the interposer,
wherein the interposer includes:
a first interposer portion disposed on the first circuit board and including a first non-shielding area and a first shielding area disposed around the first non-shielding area, the first non-shielding area and the first shielding area forming at least a portion of a first end of the first interposer portion; and
a second interposer portion disposed on the first circuit board and including a second non-shielding area and a second shielding area disposed around the second non-shielding area, the second shielding area and the second non-shielding area forming at least a portion of an end of the second interposer portion facing to the first end of the first interposer portion.

2. The electronic device of claim 1, wherein the first interposer portion is disposed on a first area of the first circuit board, and the second interposer portion is disposed on a second area of the first circuit board adjacent to the first area, and
wherein the first end of the first interposer portion includes a first dummy having central area protruding toward the second end, and the second end of the second interposer portion includes a second dummy having a central area protruding toward the first end.

3. The electronic device of claim 1, wherein the first interposer portion includes a line portion having a straight line shape and two opposite ends configured to connect with the second interposer portion or another interposer portion.

4. The electronic device of claim 3, wherein the first interposer portion includes a first dummy protruding from the two opposite ends in a first direction and a third dummy protruding from a side of the line portion in a direction perpendicular to the first direction.

5. The electronic device of claim 1, wherein the interposer is disposed between the first circuit board and the second circuit board and includes a closed loop shape configured to shield a space between the first circuit board and the second circuit board.

6. The electronic device of claim 1, wherein when viewed from a side of the interposer, the first end of the first interposer portion and the second end of the second interposer portion at least partially overlap each other.

7. The electronic device of claim 1, wherein the first end of the first interposer portion includes a first first end and a second first end protruding from the first first end, and the second end of the second interposer portion includes a first second end and a second second end protruding from the first second end, and
wherein the first first end faces the second second end and is spaced apart from the second second end by a designated distance or more, and the second first end faces the first second end and is spaced apart from the first second end by a designated distance or more.

8. The electronic device of claim 7, wherein the first interposer portion includes a first dummy protruding from an area of the second first end to the first second end, and the second interposer portion includes a second dummy protruding from an area of the second second end to the first first end.

9. The electronic device of claim 7, wherein the designated distance may be in a range of about 0.3 mm to 0.6 mm, and wherein when viewed from a side of the first interposer portion or the second interposer portion, the second first end and the second second end overlap each other.

10. The electronic device of claim 1, wherein the interposer includes a first area formed as the first interposer portion, a second area in which the first interposer portion overlaps the second interposer portion, and a third area formed as the second interposer portion, and wherein the first area and/or the third area have a plurality of vias arranged in two or three rows.

11. The electronic device of claim 10, wherein a width of the first area corresponds to a width of the third area, and wherein widths of the first interposer portion and the second interposer portion forming the second area are smaller than the width of the first area or the third area.

12. The electronic device of claim 11, wherein in the second area, the first interposer portion includes vias arranged in at least one row, and the second interposer portion includes vias arranged in at least one row corresponding to the vias arranged in the first interposer portion.

13. The electronic device of claim 1, wherein the shielding area surrounds at least a portion of the non-shielding area.

14. The electronic device of claim 1, further comprising a housing including a first space and a second space adjacent to the first space, and wherein a circuit board module is positioned in the first space, and a battery electrically connected with the circuit board module is positioned in the second space.

* * * * *